US007872397B2

(12) United States Patent
Clingman et al.

(10) Patent No.: US 7,872,397 B2
(45) Date of Patent: Jan. 18, 2011

(54) ELECTRICAL TO MECHANICAL ENERGY CONVERTER

(75) Inventors: Dan J. Clingman, Auburn, WA (US); Lynn M. Gravatt, Seattle, WA (US)

(73) Assignee: The Boeing Company, Chicago, IL (US)

( * ) Notice: Subject to any disclaimer, the term of this patent is extended or adjusted under 35 U.S.C. 154(b) by 536 days.

(21) Appl. No.: 11/679,478

(22) Filed: Feb. 27, 2007

(65) Prior Publication Data

US 2009/0224633 A1 Sep. 10, 2009

Related U.S. Application Data

(63) Continuation-in-part of application No. 11/613,893, filed on Dec. 20, 2006, now Pat. No. 7,541,720.

(51) Int. Cl.
*H01L 41/04* (2006.01)
(52) U.S. Cl. .................... 310/328; 310/329; 310/331
(58) Field of Classification Search ......... 310/328–332, 310/323.01–323.21
See application file for complete search history.

(56) References Cited

U.S. PATENT DOCUMENTS

| 4,769,569 | A | * | 9/1988 | Stahlhuth | 310/328 |
| 5,712,524 | A | * | 1/1998 | Suga | 310/328 |
| 6,265,810 | B1 | | 7/2001 | Ngo | |
| 6,307,301 | B1 | | 10/2001 | Ngo et al. | |
| 6,320,707 | B1 | | 11/2001 | Khoshnevisan et al. | |
| 6,392,329 | B1 | * | 5/2002 | Bryant et al. | 310/328 |
| 6,563,250 | B2 | | 5/2003 | Mathur | |
| 6,858,970 | B2 | | 2/2005 | Malkin et al. | |
| 6,894,460 | B2 | | 5/2005 | Clingman | |
| 2005/0258715 | A1 | * | 11/2005 | Schlabach | 310/331 |
| 2006/0202592 | A1 | * | 9/2006 | Ruggeri et al. | 310/349 |
| 2009/0085444 | A1 | * | 4/2009 | Rivera et al. | 310/365 |

* cited by examiner

*Primary Examiner*—Walter Benson
*Assistant Examiner*—Derek J Rosenau
(74) *Attorney, Agent, or Firm*—Harness, Dickey & Pierce, P.L.C.

(57) ABSTRACT

An energy conversion apparatus having a pair of flexible beams that are supported at first ends thereof from a base. The beams each include at least one piezoelectric material layer. Second ends of each of the beams are operatively coupled to rigid links. The rigid links are in turn operatively coupled to a working element that may form, in one application, a drive member for a motor, or in a second application form a valve element for an electronic fuel injection system, or in a third application form a piston for a fluid pump. The working element is free to move linearly in a path generally parallel to the longitudinal axes of the flexible beams. As electrical signals are applied to and removed from the piezoelectric material layer(s) of each flexible beam, the beams flex repeatedly and uniformly over their full lengths. This causes a linear movement of the working element that can be used to help form a rotational motor output or a linearly moving fluid control element.

18 Claims, 9 Drawing Sheets

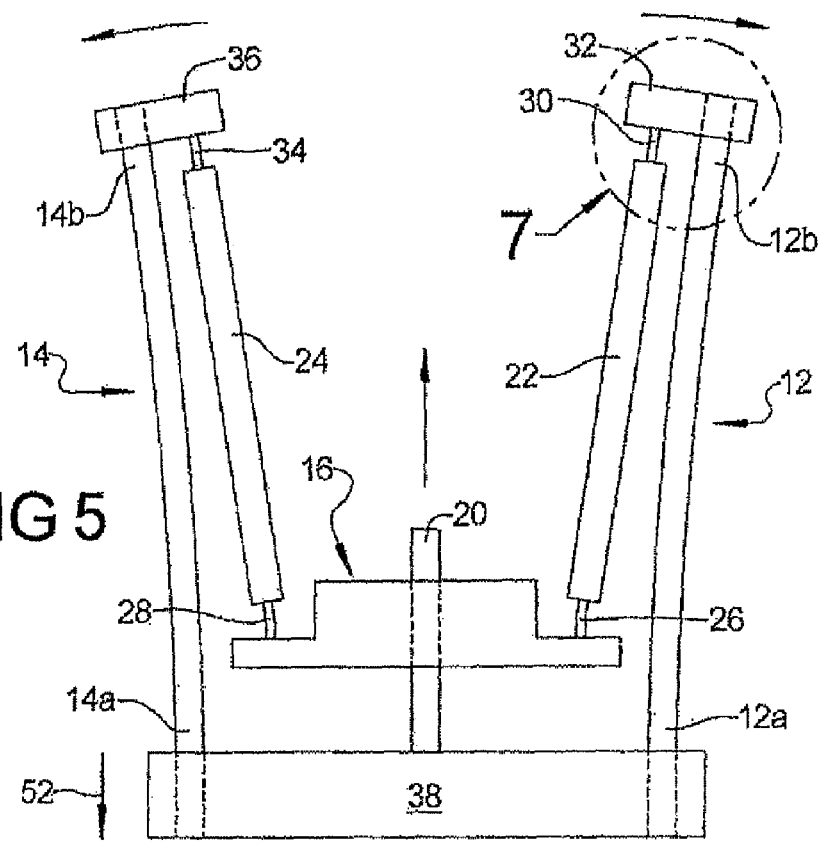
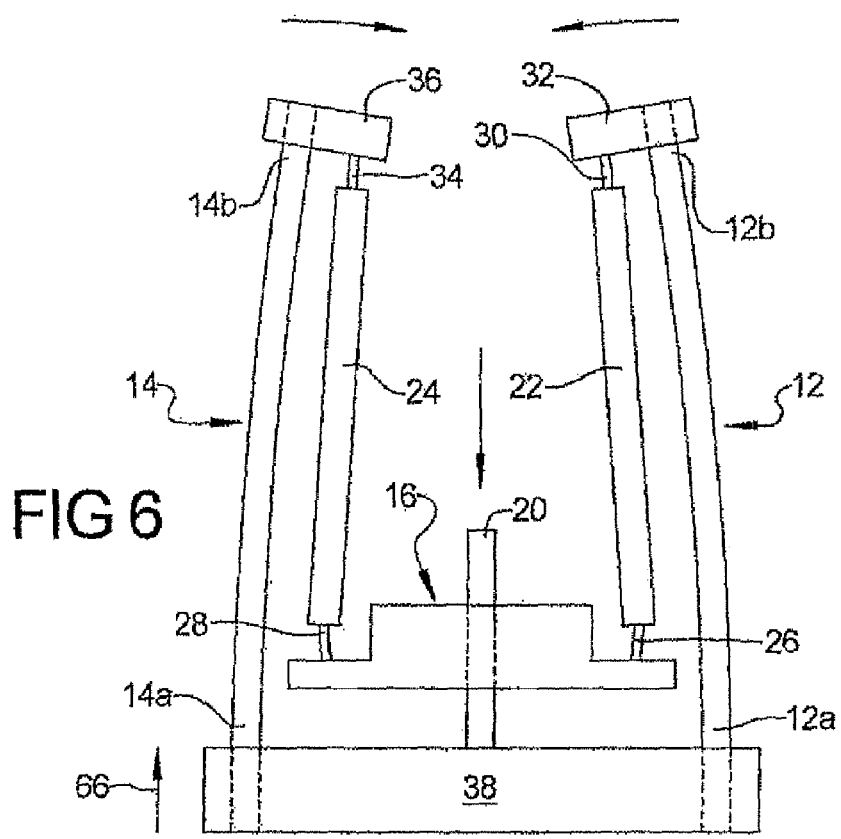

ELECTRICAL TO MECHANICAL ENERGY CONVERTER

CROSS-REFERENCE TO RELATED APPLICATIONS

The present application is a continuation-in-part of U.S. application Ser. No. 11/613,893, filed Dec. 20, 2006. The present application is also related in general subject matter to U.S. patent application Ser. No. 11/613,902, also filed on Dec. 20, 2006. The disclosures of both of the above applications are hereby incorporated by reference into the present application.

FIELD

The present disclosure relates to system and methods for converting electrical energy to mechanical motion, and more particularly to systems and methods that make use of electrically responsive, flexible beams for converting electrical signals to mechanical energy that is useful for forming a motor or fluid control member.

BACKGROUND

The statements in this section merely provide background information related to the present disclosure and may not constitute prior art.

There is increasing interest in the use of energy harvesting apparatuses and methods for harvesting vibration energy experienced by various forms of mobile platforms, for example, spacecraft, aircraft, and automotive vehicles. Energy harvesting apparatuses and methods can be used to harvest vibration energy for the purpose of generating electrical signals to power various forms of sensors or actuators, or to control other electronic or electro-mechanical devices.

Previously developed vibration harvesting devices often make use of a cantilever beam. The cantilever beam is fixedly supported from a support structure at a first end, where the first structure experiences vibration energy. A second end of the cantilever beam is free to move in response to the vibration energy experienced by the beam. The vibration energy typically forms a force that is applied along an axis that is directed perpendicular to the longitudinal length of the beam at the outermost tip of the beam (i.e., in this example the second end of the beam), as indicated in FIG. 1. When such a perpendicularly directed force is applied to the beam, typically the stress and/or strain experienced by the beam is greatest at the root area of the beam (i.e., the area where the beam is secured to the support structure) when the beam flexes into the dashed position shown in FIG. 1. For example, if the beam comprises a piezoceramic material, the energy distribution within the piezoceramic material may look similar to what is disclosed in FIG. 2. FIG. 2 illustrates that the majority of the piezoceramic energy developed during flexing of the beam occurs at the root area of the beam. Thus, a majority of the length of the beam produces only a small amount of energy as the beam is deflected. This characteristic thus tends to limit the efficiency of the piezoceramic material of the beam in generating electrical energy during flexing movement of the beam.

The above shortcomings with cantilever beams apply with equal force to applications where the cantilever beam is being used to convert electrical energy into mechanical motion. With such systems, the inefficiency of the cantilever beam arrangement results in only a relatively small degree of bending of the cantilever beam, principally at its root, when the electrical signal is applied. Consequently, only a limited amount of mechanical motion is provided for a given magnitude of electrical signal. This drawback has limited the efficiency/effectiveness of cantilever beam systems in motor and fluid control applications.

SUMMARY

The present disclosure relates to energy conversion apparatuses and methods that are useful in converting electrical energy into useful mechanical energy.

In one exemplary form an apparatus is presented that enables electrical energy to be converted into mechanical energy that is used to drive an input for a motor. At least one flexible beam having an electrically responsive material receives electrical signals from a signal generator. This causes a flexing over substantially an entire length of the flexible beam, rather than just at its root area, where it is attached to a support structure. A moment conversion subsystem converts a moment generated at a free end of the flexible beam into linear motion that is applied to a working member. The linear motion of the working member is used as an input to drive a motor. In one exemplary application a pair of flexible beams are employed and electrical signals are applied to electrically responsive materials on each of the flexible beams. In one specific form the electrically responsive material comprises at least one piezoceramic material layer.

In another exemplary embodiment a fuel flow control valve is disclosed. The fuel flow control valve makes use of at least one flexible beam having an electrically responsive material layer thereon. A moment conversion subsystem converts flexing motion of a free end of the flexible beam into a linear motion as an electrical signal is applied to the electrically responsive material. A working element in the form of a valve is driven linearly by the moment conversion subsystem. The electrically responsive material may be a layer of piezoceramic material. In one specific form the valve is used in a fuel injection system. A pair of flexible beams each having a piezoceramic material layer thereon receive electrical signals from a signal generator, which is in turn controlled by a fuel management computer. The flexing of the beams controls opening and closing of the valve, which controls the flow of fuel through a fuel rail.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 5 is an illustration of the flexing motion of the flexible beams in response to twisting moments applied at the outermost end of each of the flexible beams, in response to vibration experienced by a mass component that cause the mass component to move upwardly;

FIG. 6 is a view of the apparatus illustrating the flexing motion of the two flexible beams as the mass component moves in a downward direction;

DETAILED DESCRIPTION

Figure 1:
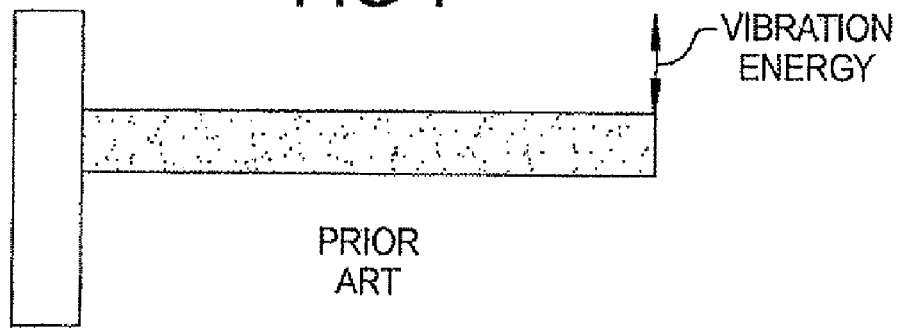
FIG. 1 is a side view of a prior art piezoceramic beam illustrating a force being applied at an outermost, tip portion of the beam, with the resulting deflection of the beam being illustrated in dashed lines.

The following description is merely exemplary in nature and is not intended to limit the present disclosure, application, or uses. It should be understood that throughout the drawings, corresponding reference numerals indicate like or corresponding parts and features.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

Figure 3:
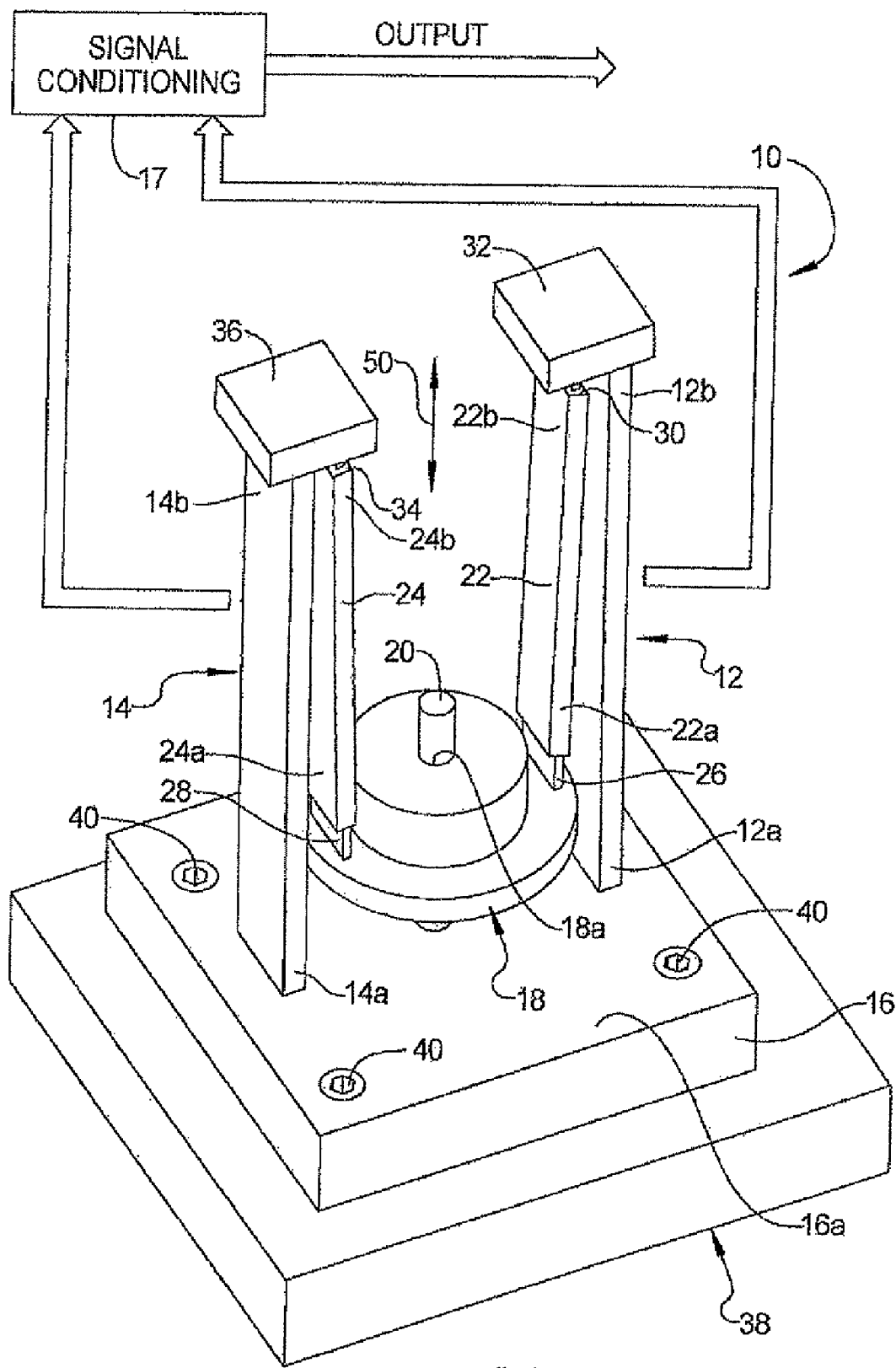
FIG. 3 is a perspective view of an energy harvesting apparatus in accordance with one embodiment of the present disclosure.

Referring to FIG. 3, an energy harvesting apparatus 10 is shown in accordance with one embodiment of the present disclosure. The apparatus 10 includes at least one flexible beam 12, and in this example a pair of flexible beams 12,14. Each of the flexible beams 12,14 is secured at a first end 12a and 14a, respectively to a base 16. The flexible beams 12,14 are also in electrical communication with a signal conditioning subsystem 17 that receives the electrical output signals from the flexible beams 12,14, as will be described in greater detail in the following paragraphs.

Supported for linear sliding movement on the base 16 is a mass component 18 that is guided by a rod 20 fixedly securely to the base 16 and extending generally parallel to the longitudinal axes of the flexible beams 12,14. The mass component 18 includes an opening 18a which receives the rod 20. A pair of rigid links 22 and 24 communicate motion of the mass component 18 to each of the flexible beams 12 and 14. Rigid link 22 includes a flexure 26 that connects a lower end 22a of the link 22 to the mass component 18. Similarly, rigid link 24 includes a flexure element 28 that connects the mass component 18 to a lower end 24a of the rigid link 24.

Rigid link 22 includes an upper end 22b that is coupled to a flexure 30, which is in turn coupled to a coupling element 32. The coupling element 32 is fixedly coupled to an upper end 12b of the flexible beam 12. Upper end 12b can be viewed as the "free end" of the flexible beam 12 because it is free to move in space, as compared to lower end 12a, which is fixed to the base 16. Rigid link 24 similarly includes an upper end 24b having a flexure 34 that secures the upper end 24b to a coupling element 36. The coupling element 36 is in turn fixedly secured to an upper end 14b of the flexible beam 14. The combination of the mass component 18, rigid links 22 and 24, flexures 26, 28, 30 and 34, and coupling elements 32 and 36, can collectively be viewed as a moment generating subsystem. The function of the moment generating subsystem will be described in detail momentarily.

With further reference to FIG. 3, the lower ends 12a and 14a of the flexible beams 12 and 14, respectively, may be secured in any suitable manner to the base 16. For example, the lower ends 12a and 14a may be inserted into blind recesses formed in the base 16 and secured therein by suitable adhesives, by set screws or any other suitable means. The upper ends 12b and 14b may extend through comparably shaped openings in the coupling components 32 and 36, and may be secured to the coupling components 32 and 36 by adhesives, by set screws, or by any suitable alternative structure. The flexure elements 26, 28, 30 and 34 may similarly be secured to the mass component 18 and the coupling elements 32 and 36, for example, by inserting end portions into blind recesses or holes, and using adhesives, set screws or any other securing implements. The base 16 is secured to a vibrating structure 38, in this example, by a plurality of threaded fasteners 40. However, adhesives, clamps or any other suitable structure or device could be employed to hold the base 16 securely to the structure 38.

The links 22 may be made from any material that is resistant to flexing and bending. Suitable materials may include aluminum, steel, or high strength plastics. The flexures 26, 28, 30 and 34 may be formed from relatively thin sections of spring steel or any other suitable material that is able to flex slightly. In one form, the flexures 26, 28, 30 and 34 are formed by spring steel material having a thickness in the range of between 0.003 inch-0.0003 inch (0.0762 mm-0.00762 mm). The coupling elements 32 and 36 may be formed from aluminum, high strength plastic, steel or any other suitable material able to generate a twisting moment on its associated flexible beam (12 or 14).

The structure 38 may form a portion of a non-mobile structure or a mobile platform. It is anticipated that the apparatus 10 will find particular utility in connection with airborne mobile platforms such as manned and unmanned spacecraft, on commercial and military aircraft, and on automotive vehicles such as cars, trucks, vans, busses, etc. Other potential applications include use on marine vessels.

Figure 4:
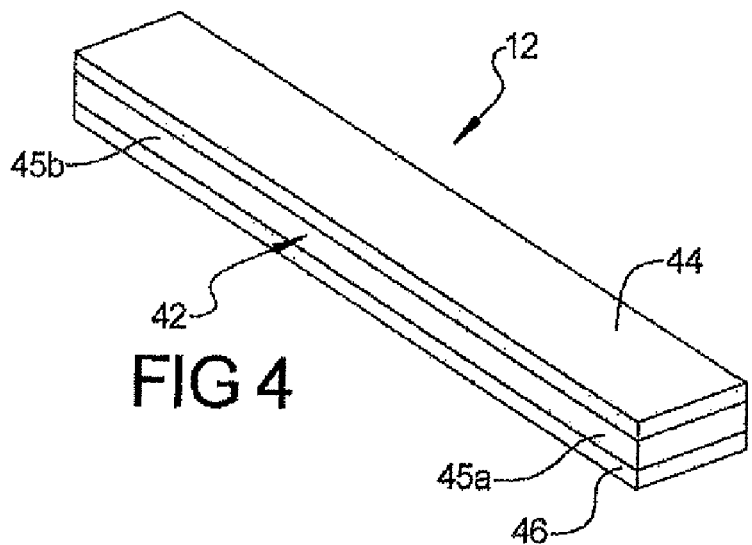
FIG. 4 is an illustration of one of the flexible beams illustrated in FIG. 3.

Referring to FIG. 4, flexible beam 12 is shown in greater detail. The flexible beam 12, in this example, is identical in construction to flexible beam 14. The flexible beam 12 includes a support substrate 42 with a pair of stress and strain responsive material layers 44 and 46 secured to opposite surfaces thereof. In one embodiment the support substrate 42 may be formed from spring steel, a conductive carbon composite, or any other conductive resilient material that is capable of flexing without breakage or fracturing. The stress and strain responsive material layers 44 and 46 may comprise piezoceramic material layers, Piezo fiber composite material layers or (piezopolymer polyvinylidene fluoride (PVDF)). For convenience, material layers 44 and 46 will be referred to throughout the following discussion is "piezoceramic" material layers 44 and 46. Using a conductive material for the support substrate provides the advantage that the electrical signals from the two piezoceramic material layers 44, 46 can be added. This is provided that the piezoceramic materials used for the layers 44, 46 are each polled during manufacture such that one will generate a positive polarity voltage when placed under tension, while the other will generate a positive voltage when placed under compression.

The piezoceramic material layers 44 and 46 may be secured to the substrate 42 by adhesives, by clamping elements, or any other suitable securing arrangements. End portion 45a may be secured within a blind recess or opening of similar dimensions in the base 16. End portion 45b may be secured in a blind recess or an opening of similar dimensions in the coupling element 32. The piezoceramic material layers 44 and 46 may vary in width, length and thickness, but in one form each has a length of about 0.5 inch-2.5 inch (12.7 mm-63.5 mm), a width of between about 0.2 inch-0.75 inch (5.08 mm-19.05 mm), and a thickness of about 0.02 inch-0.005 inch (0.508 mm-0.127 mm). The support substrate 42 typically will have dimensions similar to those of the piezoceramic material layers 44 and 46. In one example, the support substrate 42 has a thickness of about 0.002 inch-0.015 inch (0.0508 mm-0.381 mm), a width that is approximately equal to the width of each piezoceramic material layer 44,46 and a length that is approximately equal to that of each of the layers 44,46.

With further reference to FIG. 3, the mass component 18 may comprise a variety of shapes and configurations. Thus, it will be appreciated that the particular configuration illustrated in FIG. 3 is strictly exemplary. The mass component 18 may be made from aluminum, steel or any other suitable material having dimensions and a mass that is suitable to produce a twisting moment at the upper ends 12b and 14b of the flexible beams 12 and 14 in response to vibration of the structure 38. In this regard it will be appreciated that the precise dimensions and material selected for the mass component 18 may depend in part on the expected amplitude and frequency of the vibration energy that is expected to be experienced by the apparatus 10. Also, the length of the links 22 and 24 is selected such that the mass component 18 is suspended above an upper surface 16a of the base to enable motion of the mass component 18 in both directions along a vertical axis represented by arrow 50 in FIG. 3. The overall mass of the mass component 18, however, in this example, may be such that it is suspended without causing flexing of the flexible beams 12 and 14 while no vibration is being experienced by the apparatus 10.

Referring to FIGS. 5 and 6, the operation of the apparatus 10 will now be described. Referring first to FIG. 5, when the base 16 experiences a vibration force in the direction of arrow 52, the mass of the mass component 18 causes it to tend to remain stationary as the base 16 moves downwardly. The effect is that the base 16 moves downwardly away from the mass component 18, relatively speaking, which causes the rigid links 22 and 24 to exert a twisting moment at the upper end 12b of the flexible beam 12 and the upper end 14b of the flexible beam 14. The twisting moment applied to flexible beam 12 is applied by the coupling element 32, while the twisting moment to flexible beam 14 is applied by coupling element 36. The flexures 26, 28, 30 and 34 flex slightly as needed during this upward motion of the mass component 18 relative to the base 16. Electrical signals are generated by the flexible beams 12,14 as the beams flex and the signals are output to the signal conditioning subsystem 17. The signal conditioning subsystem 17 can be tailored to produce an electrical output that can be used as needed to either power other electro-mechanical or electronic devices, or to provide electrical signals to control such devices.

Figure 7:
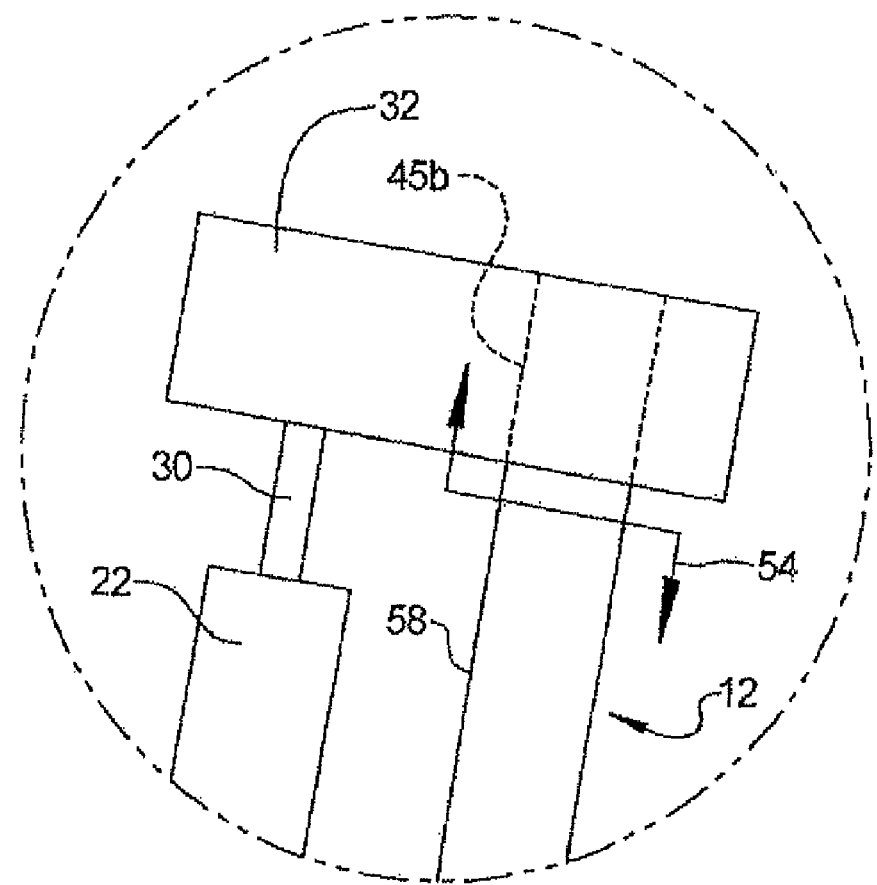
FIG. 7 is an enlarged side view of one of the flexible beams of FIG. 5 illustrating schematically the moment arm that produces a twisting action at the free end of the flexible beam.

With brief reference to FIG. 7, the twisting moment applied to the upper end 12b of flexible beam 12 is shown diagrammatically by line 54. The coupling element 32 effectively applies a downwardly directed moment at an outer surface 56 of the flexible beam 12, while an upwardly directed moment is applied at the inner surface 58 of the flexible beam 12. This causes the piezoceramic material layers 44 and 46 to experience changing levels of stress and/or strain and to each generate electric output signals that are input to the signal conditioning subsystem 17.

Figure 2:
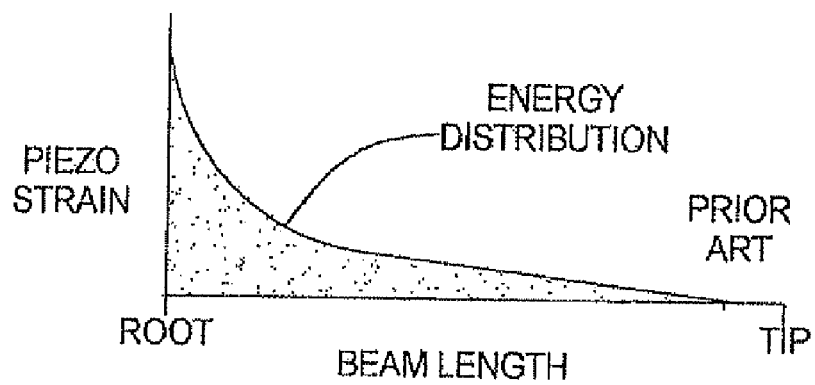
FIG. 2 is a graph of the piezoceramic energy distribution of the beam of FIG. 1.
Figure 8:
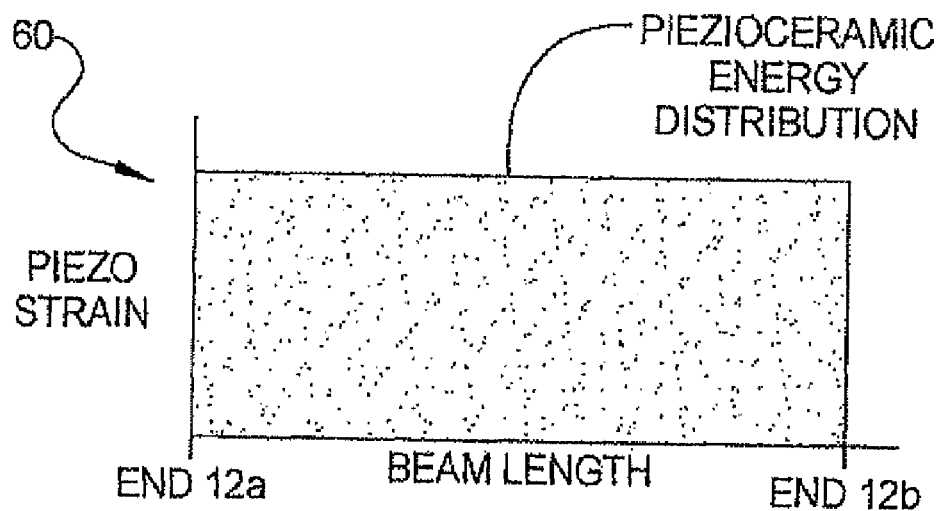
FIG. 8 is a graph of the substantially linear piezoceramic energy distribution across the length of one of the flexible beams of the apparatus of FIG. 3.

The twisting moment produced at the upper end 12b, 14b of each of the flexible beams 12,14 provides a significant advantage in that the stress and/or strain experienced by each of the beams 12,14 is applied more evenly and uniformly across the full length of the beams 12,14. With brief reference to FIG. 8, a graph 60 illustrates the linear piezoceramic energy distribution over the length of the flexible beam 12. This illustrates that the stress and strain experienced by the flexible beam 12 is distributed uniformly along the entire length of the flexible beam 12. This is in significant contrast to the piezoceramic energy distribution of FIG. 2 for a conventional cantilever beam, where the beam experiences a force at its outermost tip that is directed perpendicular to the beam's longitudinal axis. Thus, the output of the piezoceramic material layers 44 and 46 of each of the flexible beams 12,14 is significantly enhanced by the twisting moment applied at the end of each beam 12,14.

Referring now to FIG. 6, as the base 16 experiences a vibration force in the direction of arrow 66, the mass of the mass component 18 tends to hold the mass component 18 stationary. This effectively causes the mass component 18 to move towards the base 16, relatively speaking. This in turn causes the rigid links 22 and 24 to pull downwardly, thus flexing the flexible beams 12 and 14 inwardly towards one another. This causes twisting moments at the upper end 12b of flexible beam 12 and at the upper end 14b of flexible beam 14, with the twisting moments being directed essentially opposite to those produced during the flexing motion of the flexible beams 12,14 as shown in FIG. 5. Again, the piezoceramic material layers 44, 46 associated with each flexible beam 12,14 experience changing stresses and/or strains during this flexing motion and generate electrical output signals in response thereto that track the flexing action. This flexing motion of the beams 12,14 alternates between the flexing motions depicted in FIGS. 5 and 6 as the base 16 experiences oscillating vibration energy from the structure 38.

Figure 9:
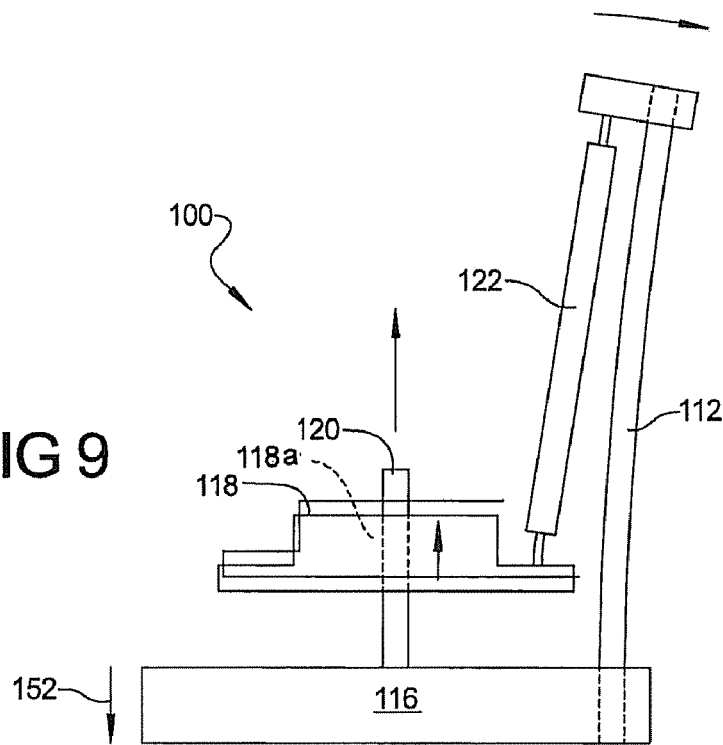
FIG. 9 is a view of another embodiment of the apparatus of the present disclosure, but incorporating only a single flexible beam that is being flexed outwardly during upward motion of a mass component.
Figure 10:
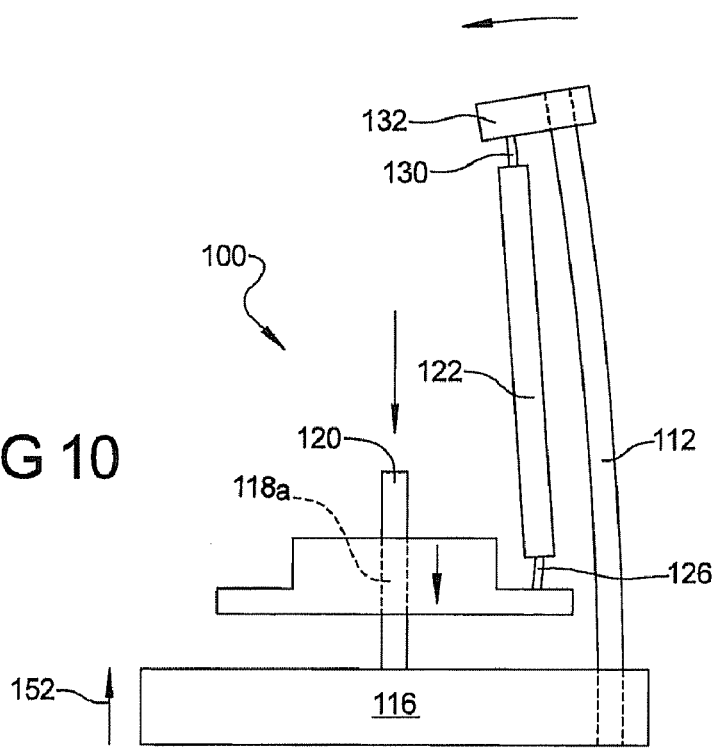
FIG. 10 is a side view of the apparatus of FIG. 9, but with the flexible beam flexing in the opposite direction in response to downward motion of the mass component.

Referring now to FIGS. 9 and 10, another embodiment 100 in accordance with the present disclosure is illustrated. The apparatus 100 is similar to apparatus 10 but instead makes use of only a single flexible beam and a single rigid link, rather than a pair of flexible beams and a pair of rigid links as with the apparatus 10. Components of the apparatus 100 in common with those described in connection with apparatus 10 are designated by reference numbers increased by 100 over those used in connection with the description of apparatus 10. Vibration energy directed in accordance with arrow 152 causes a flexing of a flexible beam 112 of the apparatus 100 as a mass component 118 moves upwardly away from a base 116 of the apparatus 100. In FIG. 10, vibration energy in the direction of arrow 152 effectively causes the mass component 118 to move towards the base 116 causing flexing of the flexible beam 112 in a direction opposite to that shown in FIG. 9. With the apparatus 100, it will be appreciated that since no counteracting force is present on the side of the mass component 118 opposite to that where the rigid link 122 is attached, a suitable bearing assembly may be required at the interface of the guide rod 120 and a bore 118a of a mass component 118 to handle the lateral loads that will be experienced during flexing of the flexible beam 112.

Figure 11:
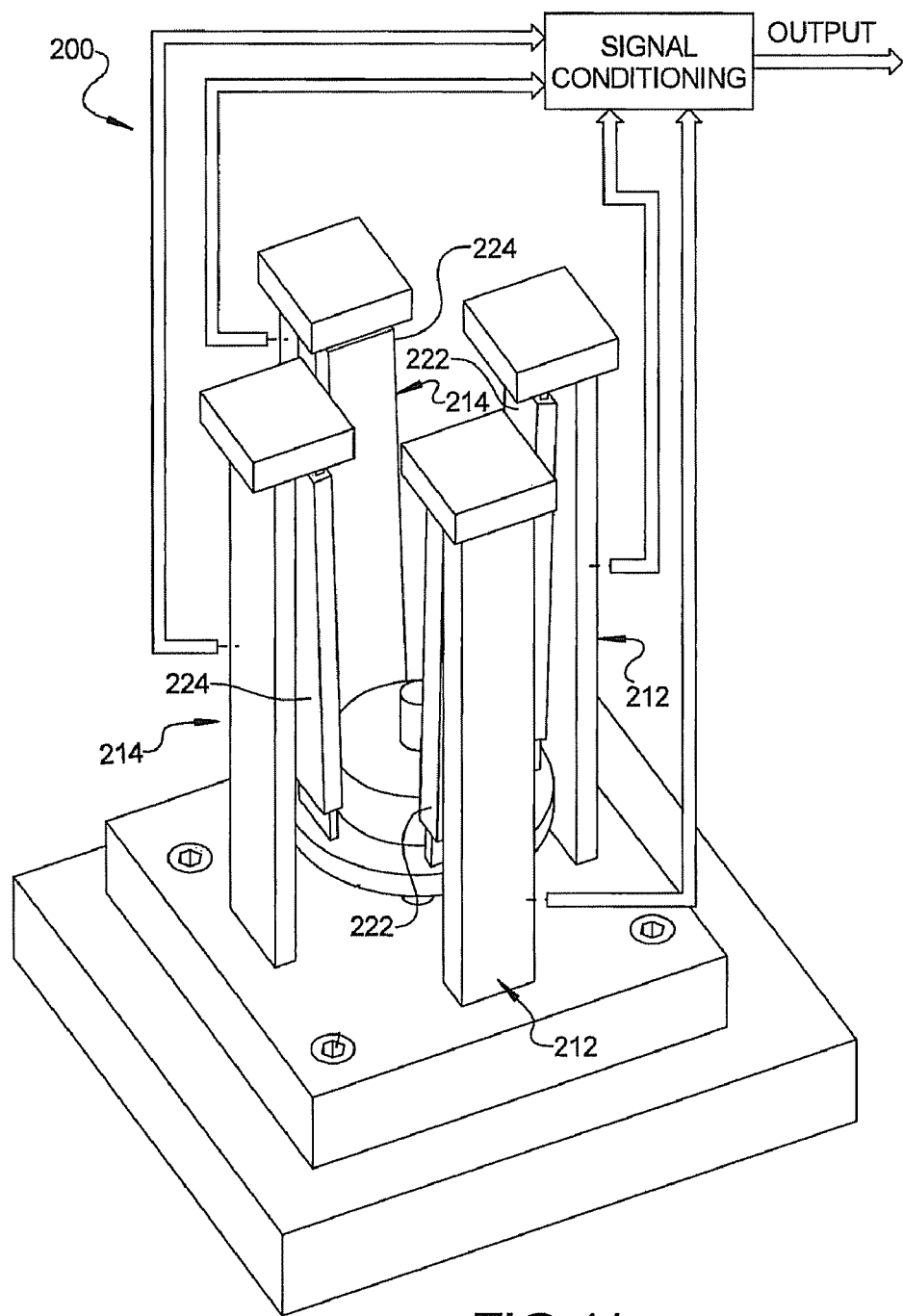
FIG. 11 is a perspective view of another energy harvesting apparatus that makes use of four flexible beams for generating electrical signals simultaneously in response to movement of a mass component.

Referring now to FIG. 11, an apparatus 200 in accordance with another embodiment of the present disclosure is illustrated. The apparatus 200 is similar to apparatus 10 but includes four flexible beams rather than two. Components in common with the apparatus 10 are designated by reference numbers in FIG. 11 increase by 200 over those used to describe the apparatus 10. In this example, essentially a pair of flexible beams 212 and a pair of flexible beams 214 are incorporated, together with corresponding pairs of rigid links 222 and 224. The apparatus 200 otherwise operates identically to apparatus 10, but can be expected to provide essentially double the electrical output provided by the apparatus 10. From FIG. 11 it will be appreciated that virtually any number of flexible beams could be incorporated, depending upon the required electrical output, the expected amount of vibration energy, and other factors relating to a specific application.

The various embodiments described thus far all enable vibration energy to be harvested and used to produce electrical energy. The various embodiments are expected to find particular utility in those applications where it would be difficult or impossible to route conductors to a remotely located sensor or other form of component that experiences vibration, in order to power such a sensor or component. In such applications, locating one of the embodiments of a vibration energy harvesting apparatus as described herein in proximity to the sensor or component would enable the apparatus to provide power to the sensor or component, thus eliminating the need to run electrical conductors to the remotely located sensor or component.

Figure 12:
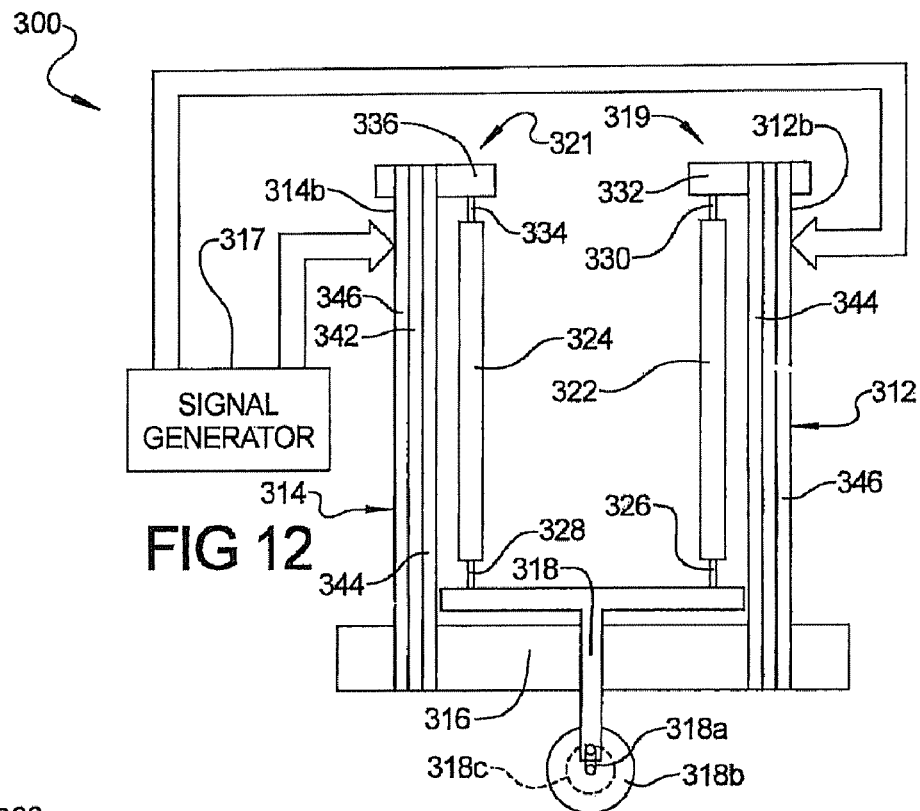
FIG. 12 is a side view of an electrical to mechanical energy conversion system that forms a motor for supplying rotational output.
Figure 13:
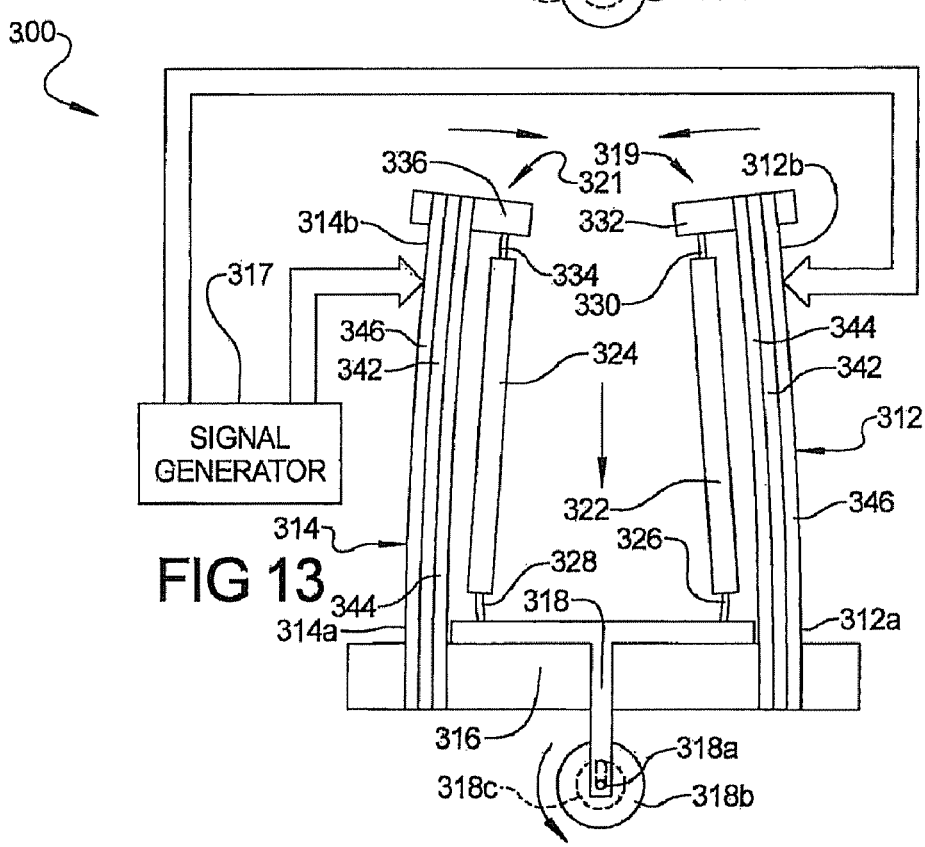
FIG. 13 illustrates the system of FIG. 12 with the flexible beams of the system in their fully flexed orientations, and a consequent degree of rotational movement having been provided to a driven element used to help produce the rotational output.

Referring now to FIGS. 12 and 13, an electrical to mechanical energy conversion apparatus 300 is illustrated. It will be appreciated the apparatus 300 is similar in basic construction to the apparatus 100, and components in common with apparatus 100 will be designated by reference numerals increased by 300 over those used to describe apparatus 100. The principal difference between apparatuses 10 and 300 is that the apparatus 300 receives electrical energy and converts the electrical energy into useful mechanical energy, whereas the apparatus 10 receives mechanical energy (i.e., vibration energy) and converts it into useful electrical energy.

Referring to FIGS. 12 and 13, the apparatus 300 includes a pair of flexible beams 312 and 314 that are each identical in construction to flexible beams 12 and 14, respectively, shown in FIG. 1. The flexible beams are similarly supported from a base 316, however, in this application the base 316 is stationary and does not move. The beams 312,314 are further each operably coupled to moment converting subsystems 319, 321 at their upper ends 312b,314. Each moment converting subsystem 319,321 is identical in construction to the moment generating subsystems described in connection with apparatus 10 with the exception that a working element 318 is substituted in place of the mass component 18. Thus, moment converting subsystem 319 includes flexure 328, rigid link 324, flexure 334 and coupling element 336. Similarly, moment generating subsystem 321 includes flexure 326, rigid link 322, flexure 330 and coupling element 332. Both flexures 326 and 328 are coupled to the working element 318.

In apparatus 300, the working element 318 forms a link member that is coupled to an eccentric link 318a. Eccentric link 318a in turn is coupled to a sprocket 318b having a concentric output shaft 318c. However, any well know form of linkage or intercoupling arrangement could be employed that enables a linear motion of an input element to be used to generate a corresponding rotational movement of an output element. In this example, components 318a, 318b and 318c essentially form a motor, with the working element acting as an input component to the motor.

In operation, a signal generator 317 generates electrical signals that may be applied to both of the flexible beams 312,314. Preferably, the signals are applied simultaneously to the piezoceramic material layers 344 and 346 of each flexible beam 312,314. The beams 312,314 flex generally uniformly over substantially their entire lengths. As the electrical signals are applied to and removed from the flexible beams, this causing an oscillating, arcuate motion at the upper end 312b, 314b of the flexible beams 312,314, with the moment converting subsystems 319,321 converting this oscillating arcuate motion into a linear motion. Essentially, the rigid links are driven in an up-down oscillating manner in accordance with arrow 370. This causes a corresponding, linear oscillating motion of the working element 318. The linear, oscillating motion of the working element is translated into a rotation motion by the components 318a,318b, and 318c. The frequency of oscillation of the electrical signal applied to the piezoceramic layers 344,346 principally controls the speed of the output member 318c.

A principal advantage of the apparatus 300 is that since the flexible beams 312,314 bend along substantially their entire lengths, a highly efficient conversion of electrical to mechanical energy takes place. In effect, a greater "stroke length" for the working element 318 is achieved for a given electrical input to the piezoceramic layers 344,346, which translates into greater efficiency for a motor formed by the apparatus 300.

Figure 14:
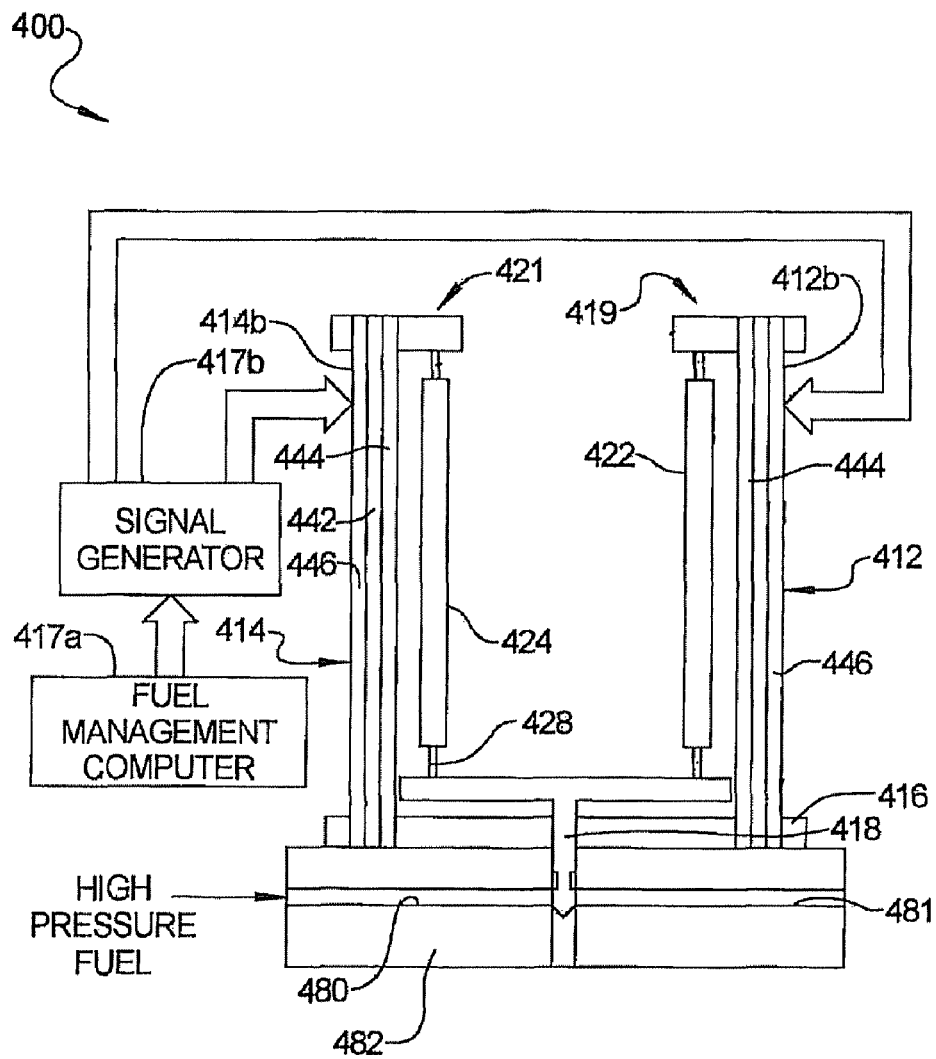
FIG. 14 illustrates another application of the system and method being used to form a fuel injection valve system, with a valve of the system being in a closed position.
Figure 15:
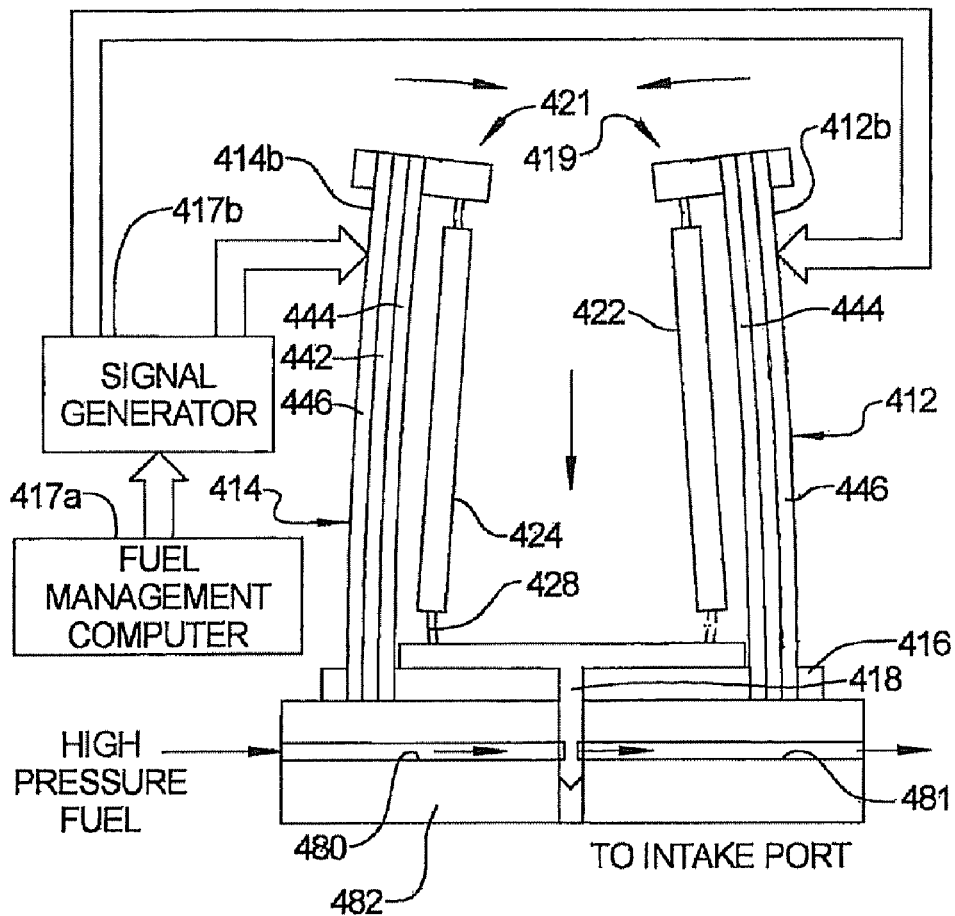
FIG. 15 illustrates the system of FIG. 14 but with the valve in an open position.

Referring now to FIGS. 14 and 15, an apparatus 400 is illustrated that is well suited for use as a flow control system. Apparatus 400 is essentially identical to apparatus 300, and components in common with apparatus 300 are designated by reference numerals increased by 100 over those used to describe apparatus 300. The principal difference between apparatus 300 and apparatus 400 is that apparatus 400 makes use of a working element 418 that forms a valve for controlling a fluid flow, and will thus be referred throughout the following description as a "valve". By the term "fluid", it will be understood that any flowable medium is contemplated, and is therefore not limited to only a liquid or a gas. However, the apparatus 400 is expected to find particular utility in electronically controlled fuel injection systems, and the following description of the operation of the apparatus 400 will be with reference to such an exemplary application.

A fuel management computer 417a drives an electrical signal generator 417b. The electrical signal generator 417b generates electrical signals that are applied to the piezoceramic layers 444,446 of each piezoceramic beam 412,414. This causes an arcuate motion at the upper end 412b,414b of the flexible beams 412,414 that is converted to a linear motion by the moment conversion subsystems 419,421. The rigid links 422,424 drive the valve 418 to opened and closed positions according to the fuel needs determined by the fuel management computer 417a. Again, the frequency of the electrical signals from the signal generator 417b principally controls the frequency at which the valve 418 opens and closes. When the valve 418 is opened, fuel is able to flow through a fluid supply passageway 480 in a fuel rail component 482, through a fluid discharge line 481, and into an intake port of an intake manifold (not shown). Again, the ability of the flexible beams 412,414 to flex generally uniformly and substantially over their entire lengths produces a greater length of travel for the valve 418.

Figure 16:
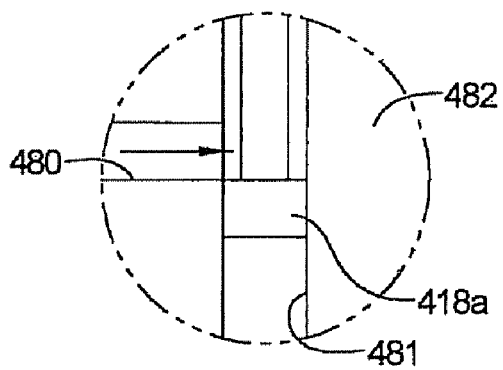
FIG. 16 is a side view of a piston to illustrate how the working element can be used to form a fluid pump.

FIG. 16 illustrates the valve 418 having been replaced by a piston 418*a*. Suitable check valves (not shown) could be included in the fluid flow passageway 480 and the fluid discharge line 481 to enable the piston 418*a* to pump fluid. It will be appreciated that this embodiment is not limited to use with only a fuel system, but could be employed in a wide variety of applications where it is desired to pump a fluid or possibly even a semi-solid.

It will be appreciated that the apparatus 400 could just as readily be configured with the valve 418 being replaced by an actuator element, to thus control operation of an actuator. The apparatus 400 could be implemented in virtually any application where a member needs to be moved linearly to perform a given task or work operation, or to function as an input to another component or subsystem.

Further areas of applicability will become apparent from the description provided herein. It should be understood that the description and specific examples are intended for purposes of illustration only and are not intended to limit the scope of the present disclosure.

What is claimed is:

1. An electrical to mechanical energy conversion apparatus, comprising:
   a flexible beam that flexes substantially over its full length in response to electrical signals applied thereto;
   said flexible beam having a first end fixedly and non-rotationally supported against movement, and a second end able to move to enable flexing of said flexible beam, and an electrically responsive material that flexes in response to said electrical signals, the second end of the flexible beam moving in an arcuate path;
   a moment converting subsystem in communication with said second end of said flexible beam for translating a moment generated at said second end of said flexible beam, as a result of movement in said arcuate path, into a linear motion;
   a working element operably associated with said moment converting subsystem; and
   a component for interacting with the working element to guide and maintain the working element moving along a linear reciprocating path.

2. The apparatus of claim 1, further comprising:
   a rotational motion generating subsystem coupled to said working element system for generating a rotational output from linear motion of said working element.

3. The apparatus of claim 1, wherein said second end of said flexible beam oscillates in the arcuate motion along said an arcuate path in response to the application of and removal of electrical signals from said electrically responsive material; and
   wherein said oscillating motion of said second end is converted to reciprocating linear motion of said working element by said moment converting subsystem.

4. The apparatus of claim 1, wherein said working element forms a valve.

5. The apparatus of claim 4, wherein said valve comprises a valve for controlling a flow of fuel in an electronic fuel injection system.

6. The apparatus of claim 1, wherein said working element forms a piston.

7. The apparatus of claim 1, wherein said flexible beam comprises a flexible substrate for supporting said electrically responsive material.

8. The apparatus of claim 7, wherein said flexible beam comprises:
   a flexible substrate; and
   a layer of electrically responsive material disposed on opposing surfaces of said flexible substrate.

9. The apparatus of claim 1, wherein said electrically responsive material comprises a piezoelectric material layer.

10. The apparatus of claim 1, further comprising:
    a pair of said flexible beams arranged generally parallel to one another; and
    a base for fixedly supporting said first end of each of said flexible beams.

11. The apparatus of claim 1, wherein said moment generating subsystem comprises:
    a coupling component secured to said second end of said flexible beam;
    a first flexure secured to said coupling component; and
    a link coupled to said first flexure at a first end thereof; and
    a second flexure coupled to a second end of said link.

12. An electrical to mechanical energy conversion apparatus, comprising:
    a pair of flexible beams supported adjacent one another,
    each said flexible beam having a first end fixedly and non-rotationally supported against movement, and a second end able to move to enable flexing of said each said second end of each said flexible beam along an arcuate path, with a first plane being tangent to the arcuate path, and an electrically responsive material that flexes in response to an application of electrical signals thereto;
    a moment converting subsystem in communication with said second ends of said flexible beams for translating a moment generated at each said second end into a linear motion within a second plane non-parallel to said first plane;
    a pair of links coupled to the second ends of the flexible beam;
    a pair of flexures interfacing the pair of links to the second ends of the flexible beam;
    a working element operably associated with said moment converting subsystem and coupled to the links.

13. The apparatus of claim 12, wherein said flexible beams are supported generally parallel to one another.

14. The apparatus of claim 12, wherein each said beam comprises a piezoelectric material layer on a surface thereof.

15. The apparatus of claim 12, wherein each said beam comprises a pair of piezoelectric material layers on opposing surfaces thereof.

16. The apparatus of claim 12, wherein said working element forms a valve.

17. The apparatus of claim 12, wherein said working element forms an input linkage assembly for converting linear motion provided by an output end of said moment converting subsystem into a rotational output.

18. An electrical to mechanical energy conversion apparatus, comprising:
    a flexible beam that flexes substantially over its full length in response to electrical signals applied thereto;
    said flexible beam having a first end fixedly and non-rotationally supported against movement, and a second end able to move to enable flexing of said flexible beam, and an electrically responsive material that flexes in response to said electrical signals, the second end of the flexible beam moving in an arcuate path, and a first plane being tangent to the arcuate path;

a moment converting subsystem in communication with said second end of said flexible beam for translating a moment generated at said second end of said flexible beam into a linear motion, said moment converting subsystem including:

a coupling component secured to said second end of said flexible beam;

a first flexure secured to said coupling component; and a link coupled to said first flexure at a first end thereof, and a second flexure coupled to a second end of said link; and a working element operably associated with said moment converting subsystem.

* * * * *